(12) United States Patent
Nie et al.

(10) Patent No.: US 11,345,850 B2
(45) Date of Patent: May 31, 2022

(54) COMPOSITE AND PREPARATION METHOD THEREOF AND APPLICATION THEREOF

(71) Applicant: TCL Technology Group Corporation, Huizhou (CN)

(72) Inventors: Zhiwen Nie, Huizhou (CN); Yixing Yang, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 0 days.

(21) Appl. No.: 16/959,066

(22) PCT Filed: Sep. 30, 2019

(86) PCT No.: PCT/CN2019/103583
§ 371 (c)(1),
(2) Date: Jun. 29, 2020

(87) PCT Pub. No.: WO2020/063253
PCT Pub. Date: Apr. 2, 2020

(65) Prior Publication Data
US 2020/0325392 A1 Oct. 15, 2020

(30) Foreign Application Priority Data
Sep. 30, 2018 (CN) .......................... 201811155827.4

(51) Int. Cl.
*C09K 11/02* (2006.01)
*C09K 11/08* (2006.01)
(Continued)

(52) U.S. Cl.
CPC ........ *C09K 11/025* (2013.01); *C09K 11/0883* (2013.01); *C09K 11/59* (2013.01);
(Continued)

(58) Field of Classification Search
CPC ....... H01L 51/502; B82Y 20/00; B82Y 30/00; C09K 11/025; C09K 11/0883; C09K 11/59; C09K 11/65; C09K 11/703; C09K 11/883
See application file for complete search history.

(56) References Cited

U.S. PATENT DOCUMENTS 9,755,093 B2 * 9/2017 Choi ..................... C01B 32/184
9,935,207 B2 * 4/2018 Choi ..................... C01B 32/186
(Continued)

FOREIGN PATENT DOCUMENTS

| CN | 104263358 A | 1/2015 |
|----|-------------|--------|
| CN | 106575674 A | 4/2017 |

(Continued)

OTHER PUBLICATIONS

International Search Report issued in International Application No. PCT/CN2019/103583 dated Dec. 4, 2019 (2 pages).

*Primary Examiner* — C Melissa Koslow
(74) *Attorney, Agent, or Firm* — Osha Bergman Watanabe & Burton LLP

(57) ABSTRACT

The present application discloses a composite and its preparation method and application. The composite includes silica-coated quantum dots and graphene nanosheets on the surface of the silica-coated quantum dots; wherein the silica-coated quantum dots include quantum dots and silica layer coated on the surface of the quantum dots. And the graphene nanosheets and the silica layer is bonded by (O—)$_3$Si—R$_1$—NHCO—R$_3$—CONH—R$_2$—Si(O—)$_3$ or (O—)$_3$Si—R$_4$—SCH$_2$CH$_2$—R$_5$—Si(O—)$_3$, R$_1$, R$_2$, R$_4$, R$_5$ are respectively selected from a group consisting of a hydrocarbyl or a hydrocarbyl derivative, R$_3$ is selected from
(Continued)

a hydrocarbyl, a hydrocarbyl derivative, an aryl or an aryl derivative. The composite can further improve the stability of quantum dots without affecting the inherent optical properties of quantum dots, thereby improving luminous efficiency.

20 Claims, 3 Drawing Sheets

(51) Int. Cl.
*C09K 11/70* (2006.01)
*C09K 11/88* (2006.01)
*H01L 51/50* (2006.01)
*C09K 11/65* (2006.01)
*C09K 11/59* (2006.01)
*B82Y 20/00* (2011.01)
*B82Y 40/00* (2011.01)

(52) U.S. Cl.
CPC ............ *C09K 11/65* (2013.01); *C09K 11/703* (2013.01); *C09K 11/883* (2013.01); *H01L 51/502* (2013.01); *B82Y 20/00* (2013.01); *B82Y 40/00* (2013.01)

(56) References Cited

U.S. PATENT DOCUMENTS

2007/0155030 A1    7/2007   Yang et al.
2014/0264269 A1*   9/2014   Choi ................... H01L 51/0045
                                                    257/13

FOREIGN PATENT DOCUMENTS

CN        106727274 A    5/2017
CN        107474821 A   12/2017

\* cited by examiner (a)

(b)

Providing silica-coated quantum dots, wherein each of the silica-coated quantum dots comprises a quantum dot and a silica layer coated on a surface of the quantum dot, a surface of the silica layer is bonded with a third modifier, and the third modifier is $(O-)_3Si-R_4-SH$ or $(O-)_3Si-R_5-CH_2=CH_2$, wherein $R_4$ and $R_5$ are respectively selected from a group consisting of a hydrocarbyl or a hydrocarbyl derivative; ⟶ T01

Providing graphene nanosheets, wherein the surface of each of the graphene nanosheets is bonded with a fourth modifier, the fourth modifier is $(O-)_3Si-R_5-CH_2=CH_2$ or $(O-)_3Si-R_4-SH$; ⟶ T02

Mixing graphene nanosheets with the fourth modifier on the surface thereof and silica-coated quantum dots with the third modifier on the surface thereof to bond the silica-coated quantum dots and the graphene nanosheets by $(O-)_3Si-R_4-SCH_2CH_2-R_5-Si(O-)_3$ which is formed by the reaction between the third modifier and the fourth modifier whereby obtaining the composite; ⟶ T03

Wherein, when the third modifier is $(O-)_3Si-R_4-SH$, the fourth modifier is $(O-)_3Si-R_5-CH_2=CH_2$; when the third modifier is $(O-)_3Si-R_5-CH_2=CH_2$, the fourth modifier is $(O-)_3Si-R_4-SH$.

Figure 5

COMPOSITE AND PREPARATION METHOD THEREOF AND APPLICATION THEREOF

CROSS-REFERENCE TO RELATED APPLICATION

This application is the International Application No. PCT/CN2019/103583 for entry into US national phase with an international filing date of Aug. 30, 2019, designating US, now pending, and claims priority to Chinese Patent Applications No. 2018111558274 filed on Sep. 30, 2018, the content of which is incorporated herein by reference in its entirety.

BACKGROUND

Technical Field

This application relates to the technical field of nanomaterials, particularly, to a composite and its preparation method and application.

Description of Related Art

Quantum dots are semiconductor nanoparticles with a particle radius smaller than or close to the exciton Bohr radius, usually are composed of II-VI or III-V group elements. After quantum dots are excited by external light or electricity, the electrons in the excited state transit to lower energy levels and radiate energy in the form of light energy, emitting fluorescence. Quantum dots have the advantages of simple preparation, narrow half-width, small particles without scattering loss, high luminous efficiency and wide spectrum coverage, etc. It has a wide application prospect in the field of new display, lighting and biomarking.

Prior to that the quantum dots are truly commercialized, the issue of stability needs to be solved urgently. On the one hand, quantum dots themselves have a small distribution size, mostly below 10 nm. The specific surface area is very large, and are easily affected by environmental factors during preparation and use. For example: long-term exposure of quantum dots to the air, the contact of water and oxygen in the air will cause a lot of defects on the surface of quantum dots, thus greatly reducing its luminous efficiency and service life. On the other hand, quantum dots have a large number of long-chain organic ligands on the surface. These organic ligands are unstable at higher temperatures and can easily fall off, which significantly affects the performance of their QLED devices. Therefore, the problem of poor stability of quantum dots greatly limits the widespread application of quantum dots. At current stage, the most commonly used method to improve the stability of quantum dots is to use polymer or silica for coating, but these methods generally have some shortcomings, such as increasing the size of the quantum dots, damaging the surface of the quantum dots, and thus result in reduced light emitting efficiency.

Therefore, related technologies need to be improved and developed.

One purpose of the embodiments of the present application is to provide a composite and a preparation method and application thereof, aiming to solve the technical problems of poor stability and low luminous efficiency of existing quantum dots.

SUMMARY

To solve the above technical problems, the technical solutions adopted in the embodiments of the present application are as follows:

In the first aspect, a composite is provided, the composite comprises silica-coated quantum dots and graphene nanosheets bonded to the surface of each of the silica-coated quantum dots; wherein, each of the silica coated quantum dots comprises a quantum dot and a silica layer coated on the surface of the quantum dot, the graphene nanosheets and the silica layer are bonded by $(O-)_3Si-R_1-NHCO-R_3-CONH-R_2-Si(O-)_3$ or $(O-)_3Si-R_4-SCH_2CH_2-R_5-Si(O-)_3$, wherein $R_1$, $R_2$, $R_4$, and $R_5$ are respectively selected from a group consisting of a hydrocarbyl or a hydrocarbyl derivative, $R_3$ is selected from a group consisting of a hydrocarbyl, a hydrocarbyl derivative, an aryl, or an aryl derivative.

In the second aspect, a preparation method of the composite is provided, the preparation method comprises the following steps:

providing silica-coated quantum dots, wherein each of the silica-coated quantum dots comprises a quantum dot and a silica layer coated on a surface of the quantum dot, a surface of the silica layer is bonded with a first modifier, and the first modifier is $(O-)_3Si-R_1-NH_2$ or $(O-)_3Si-R_1-NHCO-R_3-COOH$, wherein $R_1$ is selected from a group consisting of a hydrocarbyl or a hydrocarbyl derivative, and $R_3$ is selected from a group consisting of a hydrocarbyl, a hydrocarbyl derivative, an aryl, or an aryl derivative;

providing graphene nanosheets, wherein the surface of each of the graphene nanosheets is bonded with a second modifier, the second modifier is $(O-)_3Si-R_2-NHCO-R_3-COOH$ or $(O-)_3Si-R_2-NH_2$, where $R_2$ is selected from a group consisting of a hydrocarbyl or a hydrocarbyl derivative;

mixing the graphene nanosheets with the second modifier on the surface thereof and the silica-coated quantum dots with the first modifier on the surface thereof to bond the silica-coated quantum dots and the graphene nano sheets by the $(O-)_3Si-R_1-NHCO-R_3-CONH-R_2-Si(O-)_3$ which is formed by the reaction of the first modifier and the second modifier, whereby obtaining the composite;

wherein, when the first modifier is $(O-)_3Si-R_1-NH_2$, the second modifier is $(O-)_3Si-R_2-NHCO-R_3-COOH$; when the first modifier is $(O-)_3Si-R_1-NHCO-R_3-COOH$, the second modifier is $(O-)_3Si-R_2-NH_2$.

And another preparation method of the composite is also provided, the method comprises the following steps:

providing silica-coated quantum dots, wherein each of the silica-coated quantum dots comprises a quantum dot and a silica layer coated on a surface of the quantum dot, a surface of the silica layer is bonded with a third modifier, and the third modifier is $(O-)_3Si-R_4-SH$ or $(O-)_3Si-R_5-CH_2=CH_2$, wherein $R_4$ and $R_5$ are respectively selected from a group consisting of a hydrocarbyl or a hydrocarbyl derivative;

providing graphene nanosheets, wherein the surface of each of the graphene nanosheets is bonded with a fourth modifier, the fourth modifier is $(O-)_3Si-R_5-CH_2=CH_2$ or $(O-)_3Si-R_4-SH$;

mixing graphene nanosheets with the fourth modifier on the surface thereof and silica-coated quantum dots with the third modifier on the surface thereof to bond the silica-coated quantum dots and the graphene nano sheets by $(O-)_3Si-R_4-SCH_2CH_2-R_5-Si(O-)_3$ which is formed by the reaction between the third modifier and the fourth modifier whereby obtaining the composite;

wherein, when the third modifier is $(O-)_3Si-R_4-SH$, the fourth modifier is $(O-)_3Si-R_5-CH_2=CH_2$; when the third modifier is $(O-)_3Si-R_5-CH_2=CH_2$, the fourth modifier is $(O-)_3Si-R_4-SH$.

In the third aspect, an application of the composite is provided, and the above-mentioned composite of the present application or the composite obtained by the above-mentioned preparation method of the present application is used as a light-emitting layer material of the quantum dots light-emitting diode.

The beneficial effects of the composites provided by the embodiments of the present application are summarized as follows: on the one hand, graphene nanosheets not only have excellent water/oxygen resistance, but also can effectively prevent water/oxygen from eroding quantum dots, thereby avoiding the irreversible effect on quantum dots of the composites from the external environment. And graphene nanosheets also have excellent thermal conductivity, which can improve the thermal stability of the composite. On the other hand, if graphene nanosheets contact quantum dots directly, it will cause the quenching defect of quantum dots fluorescence, and the silica layer coated on the surface of the quantum dots can effectively prevent graphene nanosheets from directly contacting the quantum dots. At the same time, the silica layer can further improve the stability of the quantum dots. Therefore, the unique structure of the composite fully exerts the excellent performance of each component. Through the synergy of the silica layer and graphene nanosheets, the stability of the quantum dots can be further improved without affecting the inherent optical properties of the quantum dots, thereby improving luminous efficiency.

BRIEF DESCRIPTION OF THE DRAWINGS

In order to more clearly explain the technical solutions in the embodiments of the present application, the drawings as needed in the embodiments or exemplary technical descriptions will briefly be introduced in the following. Obviously, the drawings in the following description are only for some embodiments of the application, for those of ordinary skill in the art, without paying any creative work, other drawings may be obtained based on these drawings.

FIG. 5 is a schematic flow chart of a preparation method of a composite provided by an embodiment of the present application.

DETAILED DESCRIPTION OF THE EXAMPLES

Figure 1:
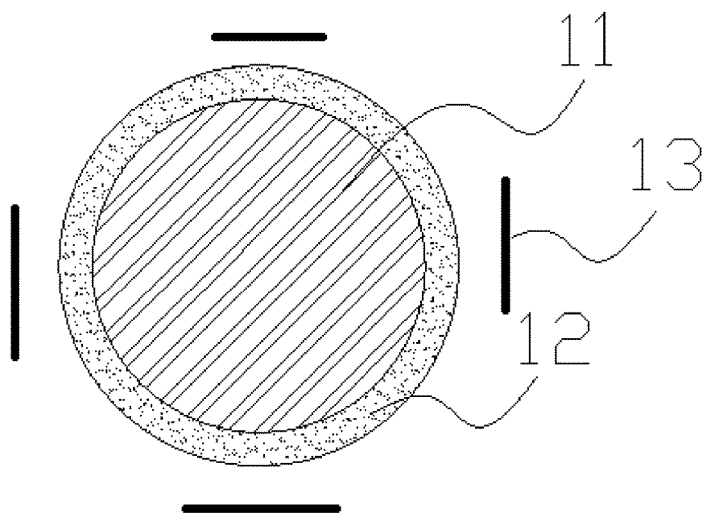
FIG. 1 is a schematic diagram of a composite provided by an embodiment of the present application.

In order to make the purpose, technical solutions and advantages of the present application clearer, the following describes the present application in further detail with reference to the accompanying drawings and embodiments. It should be understood that the specific embodiments described herein are only used to explain the present application, and are not used to limit the present application.

It should be understood that the terms of "first", "second", etc. are for descriptive purposes only, and cannot be understood as indicating or implying relative importance or implicitly indicating the number of indicated technical features. Thus, the features defined as "first" and "second" may explicitly or implicitly include one or more of the features.

A composited material is provided by some embodiments of the present application, the composite comprises silica-coated quantum dots and graphene nanosheets bonded to the surface of each of the silica-coated quantum dots; wherein, each of the silica coated quantum dots comprises a quantum dot and a silica layer coated on the surface of the quantum dot, the graphene nanosheets and the silica layer are bonded by $(O-)_3Si-R_1-NHCO-R_3-CONH-R_2-Si(O-)_3$ or $(O-)_3Si-R_4-SCH_2CH_2-R_5-Si(O-)_3$, wherein $R_1$, $R_2$, $R_4$, and $R_5$ are respectively selected from a group consisting of a hydrocarbyl or a hydrocarbyl derivative, $R_3$ is selected from a group consisting of a hydrocarbyl, a hydrocarbyl derivative, an aryl, or an aryl derivative The composite provided in the embodiments of the present application is composed of three parts: a quantum dot located inside, a silica layer covering the surface of the quantum dots, and a graphene nanosheet bonded to the outer surface of the silica layer. The surface of quantum dots can directly form a silica layer (silica-coated quantum dots), but the silica layer cannot be directly connected to graphene nanosheets, so the silica layer and graphene nanosheets are effectively connected by $(O-)_3Si-R_1-NHCO-R_3-CONH-R_2-Si(O-)_3$ or $(O-)_3Si-R_4-SCH_2CH_2-R_5-Si(O-)_3$ to form the composite of the embodiment of the present application. On the one hand, graphene nanosheets not only have excellent water/oxygen resistance, but also can effectively prevent water/oxygen from eroding quantum dots, thereby avoiding the irreversible effect on quantum dots of the composites from the external environment. And graphene nanosheets also have excellent thermal conductivity, which can improve the thermal stability of the composite. On the other hand, if graphene nanosheets contact quantum dots directly, it will cause the quenching defect of quantum dots fluorescence, and the silica layer coated on the surface of the quantum dots can effectively prevent graphene nanosheets from directly contacting the quantum dots. At the same time, the silica layer can further improve the stability of the quantum dots. Therefore, the unique structure of the composite fully exerts the excellent performance of each component. Through the synergy of the silica layer and graphene nanosheets, the stability of the quantum dots can be further improved without affecting the inherent optical properties of the quantum dots, thereby improving luminous efficiency.

Figure 2:
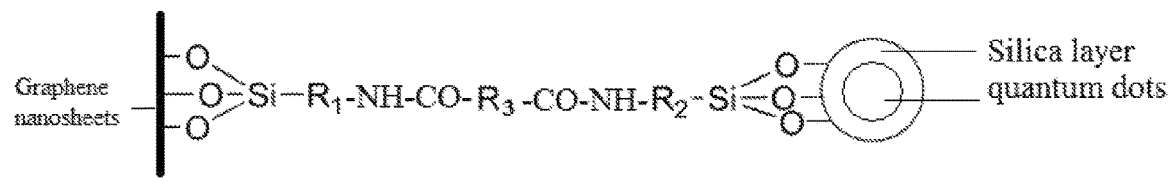
FIG. 2 is a general structure formula diagram of a composite in which graphene nanosheets and a silica layer are bonded through $(O-)_3Si-R_1-NHCO-R_3-CONH-R_2-Si(O-)_3$ according to an embodiment of the present application.
Figure 3:
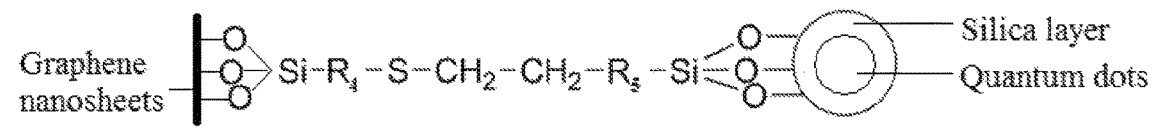
FIG. 3 is a general structure formula diagram of a composite in which graphene nanosheets and a silica layer are bonded through $(O-)_3Si-R_4-SCH_2CH_2-R_5-Si(O-)_3$ according to an embodiment of the present application.
Figure 3:
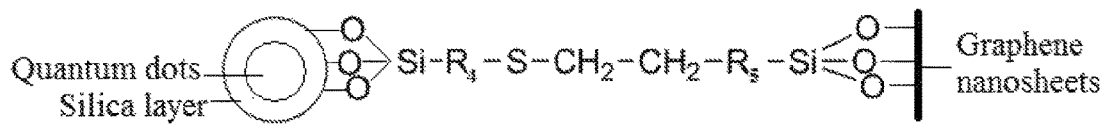

As shown in FIG. 1-3, 11 is quantum dots, 12 is a silicon layer, and 13 is graphene nanosheets; the general structure formula diagrams of the two composites are shown in FIG. 2 and FIG. 3, respectively.

For the structural form with $(O-)_3Si-R_1-NHCO-R_3-CONH-R_2-Si(O-)_3$ combination, the composite can be "graphene nanosheets $(O-)_3Si-R_1-NHCO-R_3-CONH-R_2-Si(O-)_3$ silica-coated quantum dots", or "silica-coated quantum dots $(O-)_3Si-R_1-NHCO-R_3-CONH-R_2-Si(O-)_3$ graphene nanosheets"; The structure of the connection part is symmetrical, so the two connection methods of silica-coated quantum dots and graphene nanosheets can be expressed by a general formula shown in FIG. 2.

For the structure form with (O—)$_3$Si—R$_4$—SCH$_2$CH$_2$—R$_5$—Si(O—)$_3$ combination, the composite can be "graphene nanosheets (O—)$_3$Si—R$_4$—SCH$_2$CH$_2$—R$_5$—Si(O—)$_3$ silica-coated quantum dots", or "silica-coated quantum dots (O—)$_3$Si—R$_4$—SCH$_2$CH$_2$—R$_5$—Si(O—)$_3$ graphene nanosheets"; because the structure of the connection part is asymmetric, so the two connection methods of silica-coated quantum dots and graphene nanosheets are expressed by the general formulas of FIG. 3a and FIG. 3b, respectively.

In an embodiment, in the composite provided in the embodiments of the present application, quantum dots include but are not limited to, at least one of the following groups, group II-VI quantum dots, group III-V quantum dots, group IV-VI compounds, group IV compounds, group I-III-VI quantum dots. Specifically, including any combination of one or more material selected from a group consisting of CdSe, CdS, CdTe, ZnSe, ZnS, CdTe, ZnTe; CdZnS, CdZnSe, CdZnTe, ZnSeS, ZnSeTe, ZnTeS, CdSeS, CdSeTe, CdTeS CdZnSeS, CdZnSeTe, CdZnSTe of Group II-VI; or InP, InAs, GaP, GaAs, GaSb, AN, AlP; InAsP; InNP, InNSb, GaAlNP, InAlNP of III-V Group, or CuInS$_2$, CuInSe$_2$, AgInS$_2$ of Groups I-III-VI$_2$ etc. The quantum dots can be single-core quantum dots or core-shell quantum dots.

In an embodiment, in the composite provided in the embodiments of the present application, the thickness of the silica layer is 2-20 nm; if the thickness of the silica layer is too small, the stability of the quantum dots is insufficient; if the thickness of the silica layer is too big, it affects the luminescence performance of quantum dots; therefore, within this thickness range, the comprehensive effect of quantum dots in respect of stability and luminescence performance is the best.

In an embodiment, in the composite provided in the embodiments of the present application, the size of the graphene nanosheets is 2-20 nm. Specifically, the graphene nanosheets with different sizes can co-exist with silica-coated quantum dots in different ways, their relative sizes are different, and their coating effects are different; when the size of graphene is large, such as 10-20 nm, one graphene nanosheet could bond with multiple (such as more than two) silica-coated quantum dots; when the size of graphene is moderate, such as 5-10 nm, there will be 2-3 pieces of graphene nanosheets on the surface of one silica-coated quantum dot; when the size of graphene is small, such as 2-5 nm, there will be more graphene nanosheets (such as more than 4) on the surface of one silica-coated quantum dot.

In an embodiment, in the composite provided in the embodiments of the present application, the graphene nanosheets and the silica layer are bonded by (O—)$_3$Si—R$_1$—NHCO—R$_3$—CONH—R$_2$—Si(O—)$_3$, R$_1$ and R$_2$ are respectively selected from a group consisting of a hydrocarbyl with a carbon atom number of 2-20 or a hydrocarbyl derivative with a carbon atom number of 2-20, R$_3$ is selected from a group consisting of a hydrocarbyl with a carbon atom number of 2-20, a hydrocarbyl derivative with a carbon atom number of 2-20, an aryl with a carbon atom number of 6-20, or an aryl derivative with a carbon atom number of 6-20

In an embodiment, R$_1$ and R$_2$ are respectively any one selected from the group consisting of —CH$_2$CH$_2$—, —CH$_2$CH$_2$CH$_2$—, —CH$_2$CH$_2$CH$_2$CH$_2$—, —CH$_2$CH$_2$NHCH$_2$CH$_2$—, —CH$_2$CH$_2$CH$_2$NHCH$_2$CH$_2$—, and —CH$_2$CH$_2$CH$_2$NHCH$_2$CH$_2$CH$_2$—; and/or, R$_3$ is any one selected from a group consisting of —CH$_2$CH$_2$—, —CH$_2$CH$_2$CH$_2$—,

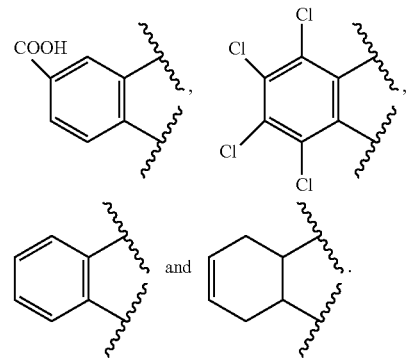

In an embodiment, in the composite provided in the embodiments of the present application, the graphene nanosheets and the silica layer are bonded by (O—)$_3$Si—R$_4$—SCH$_2$CH$_2$—R$_5$—Si(O—)$_3$, R$_4$ and R$_5$ are respectively selected from a group consisting of a hydrocarbyl with a carbon atom number of 2-20 or a hydrocarbyl derivative with a carbon atom number of 2-20. In an embodiment, R$_4$ and R$_5$ are respectively selected from a group consisting of —CH$_2$CH$_2$— or —CH$_2$CH$_2$CH$_2$—.

Figure 4:
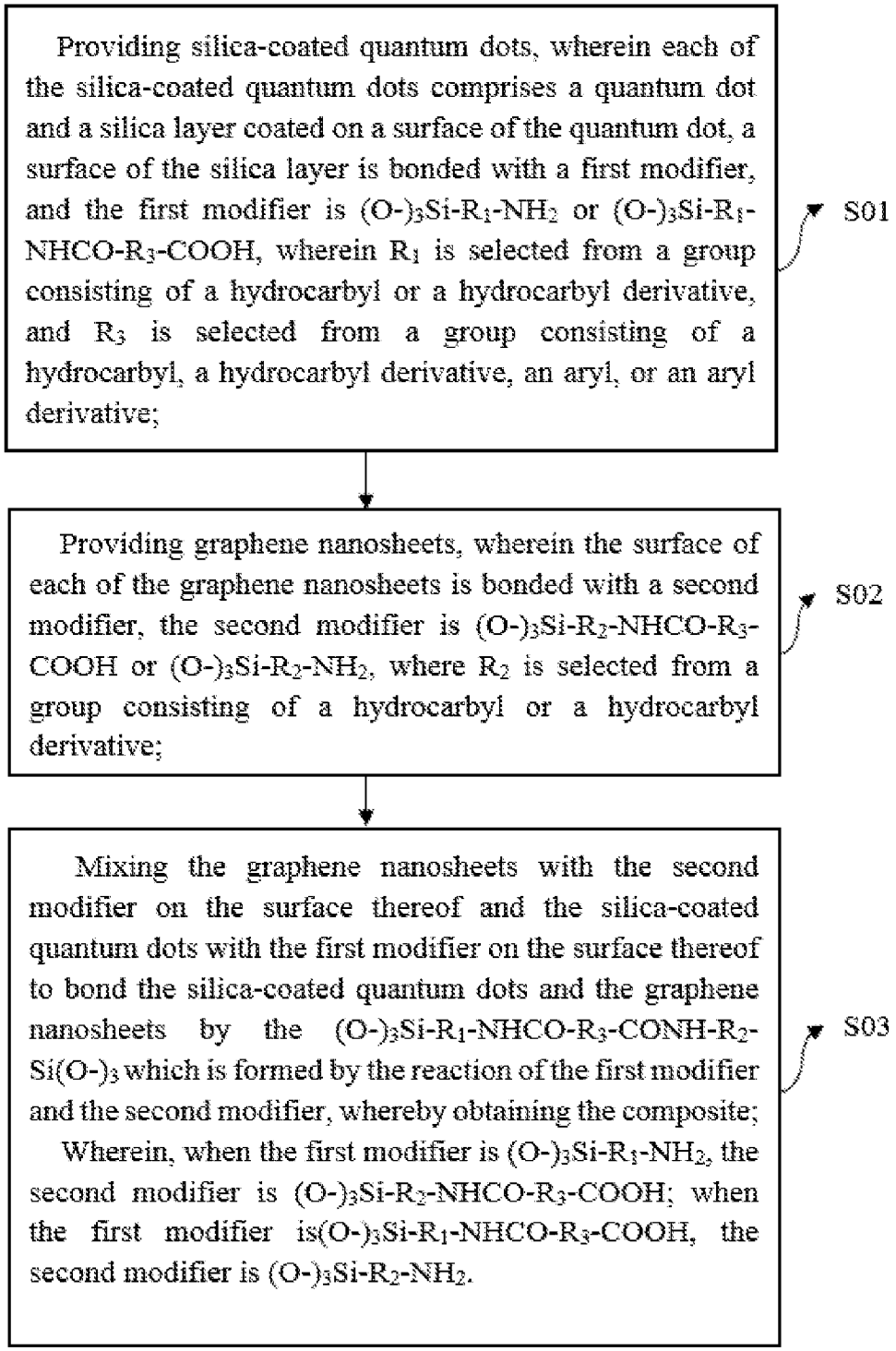
FIG. 4 is a schematic flow chart of a preparation method of a composite provided by an embodiment of the present application.

On the other hand, the embodiments of the present application provide a preparation method of the composite. As shown in FIG. 4, the preparation method includes the following steps:

S01: providing silica-coated quantum dots, wherein each of the silica-coated quantum dots comprises a quantum dot and a silica layer coated on a surface of the quantum dot, a surface of the silica layer is bonded with a first modifier, and the first modifier is (O—)$_3$Si—R$_1$—NH$_2$ or (O—)$_3$Si—R$_1$—NHCO—R$_3$—COOH, wherein R$_1$ is selected from a group consisting of a hydrocarbyl or a hydrocarbyl derivative, and R$_3$ is selected from a group consisting of a hydrocarbyl, a hydrocarbyl derivative, an aryl, or an aryl derivative;

S02: providing graphene nanosheets, wherein the surface of each of the graphene nanosheets is bonded with a second modifier, the second modifier is (O—)$_3$Si—R$_2$—NHCO—R$_3$—COOH or (O—)$_3$Si—R$_2$—NH$_2$, where R$_2$ is selected from a group consisting of a hydrocarbyl or a hydrocarbyl derivative;

S03: mixing the graphene nanosheets with the second modifier on the surface thereof and the silica-coated quantum dots with the first modifier on the surface thereof to bond the silica-coated quantum dots and the graphene nanosheets by the (O—)$_3$Si—R$_1$—NHCO—R$_3$—CONH—R$_2$—Si(O—)$_3$ which is formed by the reaction of the first modifier and the second modifier, whereby obtaining the composite;

wherein, when the first modifier is (O—)$_3$Si—R$_1$—NH$_2$, the second modifier is (O—)$_3$Si—R$_2$—NHCO—R$_3$—COOH; when the first modifier is (O—)$_3$Si—R$_1$—NHCO—R$_3$—COOH, the second modifier is (O—)$_3$Si—R$_2$—NH$_2$.

The preparation method of the composite according to the embodiment of the present application is simple, safe and easy to operate. First, the surface of the silica-coated quantum dots and the surface of the graphene nanosheets are modified, respectively, so that the respective surfaces are connected with modifiers that can react with each other, thus (O—)$_3$Si—R$_1$—NHCO—R$_3$—CONH—R$_2$—Si(O—)$_3$ is formed by the modifiers reaction which is connected to the surface. (O—)$_3$Si—R$_1$—NHCO—R$_3$—CONH—R$_2$—Si(O—)$_3$ bonds silica-coated quantum dots with graphene nanosheets together to obtain the unique structure of the composites in the embodiments of this application.

In the above preparation method, when the first modifier is (O—)$_3$Si—R$_1$—NH$_2$, the first modifier is selected from silane coupling agent with amino group, and the second modifier is selected from the modifier obtained by condensation reaction of acid anhydride and silane coupling agent with amino group. That is, the first modifier is selected from silane coupling agent with amino group (that is, amino silane coupling agent). In this case, the process of modifying the silica-coated quantum dots may include: directly using a silane coupling agent with an amino group to modify silica-coated quantum dots by amination to obtain "silica-coated quantum dots (O—)$_3$Si—R$_1$—NH$_2$". The second modifier is selected from the modifiers obtained by the condensation reaction of the silane coupling agent with amino group and the acid anhydride. In this case, the graphene nanosheets modification process may include: firstly, modify the graphene nanosheets with the silane coupling agent with amino group by amination, and then react with acid anhydride to obtain "graphene nanosheets-(O—)$_3$Si—R$_2$—NHCO—R$_3$—COOH". Finally, by the reaction of "graphene nanosheets-(O—)$_3$Si—R$_2$—NHCO—R$_3$—COOH" and "H$_2$N—R$_1$—Si(O—)$_3$-silica-coated quantum dots", the composites are obtained (FIG. 2).

Alternatively, when the second modifier is (O—)$_3$Si—R$_2$—NH$_2$, the second modifier is selected from silane coupling agent with amino group, and the first modifier is selected from the modifiers obtained from the condensation reaction of silane coupling agent with amino group and acid anhydride. That is, the first modifier is selected from modifiers obtained by condensation reaction of silane coupling agent with amino group (that is, amino silane coupling agent) and acid anhydride. In this case, the modification process of silica-coated quantum dots may include: firstly, using a silane coupling agent with an amino group to modify silica-coated quantum dots by amination and then react with acid anhydride to obtain "silica-coated quantum dots (O—)$_3$Si—R$_1$—NHCO—R$_3$—COOH". The second modifier is selected from silane coupling agents with amino group. At this time, the graphene nanosheets modification process may include: directly modifying the graphene nanosheets with a silane coupling agent with amino group by amination to obtain "H$_2$N—R$_2$—Si(O—)$_3$-graphene nanosheets". Finally, "graphene nanosheets-(O—)$_3$Si—R$_2$—NH$_2$" reacts with "HOOC—R$_3$—CONH—R$_1$—Si(O—)$_3$-silica-coated quantum dots" to produce composites.

The above-mentioned silane coupling agent with amino group is specifically selected from at least one of mono-amino silane coupling agents, di-amino silane coupling agents and tri-amino silane coupling agents. In an embodiment, the amino silane coupling agent is 3-amino propyl trimethoxy silane, 3-aminopropyl triethoxy silane, aminoethyl aminopropyl trimethoxy silane, aminopropyl triethoxy silane. The acid anhydride is selected from at least one of trimellitic anhydride, succinic anhydride, tetrachlorophthalic anhydride, Cyclopentane tetracarboxylic dianhydride, tetrahydrophthalic anhydride, phthalic anhydride and diphenyl ether tetracarboxylic dianhydride. R$_1$ and R$_2$ are the hydrocarbyl or hydrocarbyl derivatives in the silane coupling agent with amino groups, and R$_3$ is the hydrocarbyl, hydrocarbyl derivatives, aryl or aryl derivatives in the acid anhydride. In an embodiment of the present application, R$_1$ and R$_2$ are respectively selected from a group consisting of a hydrocarbyl with a carbon atom number of 2-20 or a hydrocarbyl derivative with a carbon atom number of 2-20, R$_3$ is selected from a group consisting of a hydrocarbyl with a carbon atom number of 2-20, a hydrocarbyl derivative with a carbon atom number of 2-20, an aryl with a carbon atom number of 6-20 or an aryl derivative with a carbon atom number of 6-20. In an embodiment, R$_1$ and R$_2$ are respectively selected from a group consisting of any one of —CH$_2$CH$_2$—, —CH$_2$CH$_2$CH$_2$—, —CH$_2$CH$_2$CH$_2$CH$_2$—, —CH$_2$CH$_2$NHCH$_2$CH$_2$—, —CH$_2$CH$_2$CH$_2$NHCH$_2$CH$_2$— and —CH$_2$CH$_2$CH$_2$NHCH$_2$CH$_2$CH$_2$—. R$_3$ is selected from a group consisting of any one of —CH$_2$CH$_2$—, —CH$_2$CH$_2$CH$_2$—,

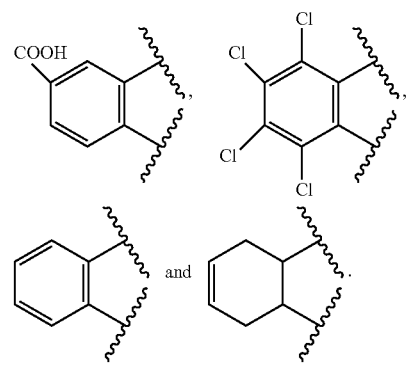

In an embodiment, in the above steps S01 and S02: the specific process of amination modification of graphene nanosheets or silica-coated quantum dots is: (1) disperse graphene nanosheets or silica-coated quantum dots in a polar solvent to form graphene nanosheets or silica-coated quantum dots solution; (2) At room temperature, add silane coupling agent with amino group and catalyst to the above graphene nanosheets or silica-coated quantum dots composite solution, and react at 40~150° C. for 20 min~24 h. When the reaction is completed, after washing and drying with water, graphene nanosheets or silica-coated quantum dots with modified surface can be obtained.

In an embodiment, the polar solvent includes at least one of water, ethanol, methanol, glycerin, propylene glycol, acetonitrile, propanol, dioxane, tetrahydrofuran, methyl ethyl ketone, n-butanol, etc.; the catalyst includes at least one of ammonia gas, ammonia solution, dimethylamine, diethylamine, trimethylamine, triethylamine, pyridine, tetramethylammonium hydroxide, tetraethylammonium hydroxide, tetra-tert-butyl ammonium hydroxide, etc.; the volume concentration of catalyst in the mixed solution is 0.1~100 mL/L; the volume concentration of the silane coupling agent with amino group in the mixed solution is 0.1~50 mL/mL.

In an embodiment, in the above steps S01 and S02: the specific process of carboxylation modification of graphene nanosheets or silica-coated quantum dots includes: (1) disperse the above graphene nanosheets or silica-coated quantum dots with amination modified surface into polar solvents, forming graphene nanosheets or silica-coated quantum dots solution with amination modified surface; (2) at room temperature, add acid anhydride to the above graphene nanosheets or silica-coated quantum dots solution with amination modified surface and react at room temperature for 20 min~24 h. When the reaction is completed, after washing and drying with water, the graphene nanosheets or silica-coated quantum dots with carboxylation modified surface can be obtained.

In an embodiment, the polar solvent includes water, ethanol, methanol, glycerin, propylene glycol, acetonitrile, propanol, dioxane, tetrahydrofuran, methyl ethyl ketone, n-butanol, etc. The mass ratio of anhydride to graphene nanosheets or silica-coated quantum dots with amination modified surface is 0.01~10:1.

In an embodiment, the preparation method of the silica-coated quantum dots includes the following: mixing a perhydropolysilazane solution with a quantum dots solution to form a silica layer on the surface of the quantum dots.

The preparation process of traditional silica-coated quantum dots requires the use of water or ammonia or other catalyst reagents. Because quantum dots have a large specific surface area, these added water, ammonia or catalyst will reduce the fluorescence yield of quantum dots to a certain extent. The preparation of silica-coated quantum dots in the embodiments of the present application is favorable to the rapid hydrolysis and oxidation of perhydropolysilazane at low temperature, thereby forming a dense silica layer on the surface of the quantum dots. This method can effectively avoid the irreversible effects on quantum dots caused by use of ammonia or catalyst in conventional coating process.

Specifically, the preparation of silica-coated quantum dots in this embodiment includes: (1) disperse the quantum dots into a non-polar solvent to form a quantum dots solution; (2) disperse perhydropolysilazane in a polar solvent and form perhydropolysilazane solution; (2) at room temperature, add perhydropolysilazane solution to the quantum dots solution described in step (1) above, and perform the reaction at room temperature for 20-24 h, the silica-coated quantum dots are obtained;

In an embodiment, the mass ratio of perhydropolysilazane to quantum dots is 0.01-10:1, and the concentration of quantum dots in the non-polar solvent is 0.01-300 mg/mL. The volume ratio of polar solvent to non-polar solvent is 0.1~100:1. The above polar solvents include hexane, cyclohexane, toluene, chlorobenzene, diethyl ether, butyl ether, tetrahydrofuran, 1,4-dioxane, acetone, cyclohexanone, methyl isobutyl ketone, ethylene glycol ether, diethylene glycol diethyl ether, diethylene glycol ether, ethylene glycol diethyl ether, ethylene glycol ether;

In an embodiment, in step S03: graphene nanosheets with the second modifier on the surface thereof and silica-coated quantum dots with the first modifier on the surface thereof are mixed, making the steps of combining silica-coated quantum dots with the graphene nanosheets by $(O-)_3Si-R_1-NHCO-R_3-CONH-R_2-Si(O-)_3$ formed by the reaction of the first modifier and the second modifier comprise: mixing the graphene nanosheets with the second modifier on the surface thereof with the silica-coated quantum dots with the first modifier on the surface thereof under an acidic condition and the action of a first initiator to conduct a condensation reaction to obtain the composite.

The first initiator is at least one selected from a group consisting of carbodiimide (EDC) and N-hydroxysuccinimide (NHS); in the amide condensation reaction, EDC or NHS is used as an activation reagent for the carboxyl group, the coupling efficiency of the amino group and carboxyl group could be improved by EDC or NHS. When the molar ratio of EDC and NHS is 1:1, the amide condensation reaction has the highest efficiency. Furthermore, the pH of the acidic condition is greater than or equal to 4 and less than 7.

Specifically, at room temperature, adjust the pH of the silica-coated quantum dots solution to be greater than or equal to 4 and less than 7, in which solution, the first modifier is bonded to the surface of the silica-coated quantum dots, and then add the graphene nanosheets solution in which the second modifier is bonded to the surface of graphene nanosheets. Under the coupling effect of EDC/NHS, the amide bond is compounded. Alternatively, adjust the pH of the graphene nanosheets solution to be greater than or equal to 4 and less than 7, in which solution the second modifier is bonded to the surface of graphene nanosheets, and then add the silica-coated quantum dots solution in which the first modifier is bonded to the surface of silica-coated quantum dots. Under the coupling effect of EDC/NHS, the amide bond is compounded to complete the preparation of the composite.

One embodiment of the present application also provides a preparation method of a composite. As shown in FIG. 5, the method includes the following steps:

T01: providing silica-coated quantum dots, wherein each of the silica-coated quantum dots comprises a quantum dot and a silica layer coated on a surface of the quantum dot, a surface of the silica layer is bonded with a third modifier, and the third modifier is $(O-)_3Si-R_4-SH$ or $(O-)_3Si-R_5-CH_2=CH_2$, wherein $R_4$ and $R_5$ are respectively selected from a group consisting of a hydrocarbyl or a hydrocarbyl derivative;

T02: providing graphene nanosheets, wherein the surface of each of the graphene nanosheets is bonded with a fourth modifier, the fourth modifier is $(O-)_3Si-R_5-CH_2=CH_2$ or $(O-)_3Si-R_4-SH$;

T03: mixing graphene nanosheets with the fourth modifier on the surface thereof and silica-coated quantum dots with the third modifier on the surface thereof to bond the silica-coated quantum dots and the graphene nano sheets by $(O-)_3Si-R_4-SCH_2CH_2-R_5-Si(O-)_3$ which is formed by the reaction between the third modifier and the fourth modifier whereby obtaining the composite;

wherein, when the third modifier is $(O-)_3Si-R_4-SH$, the fourth modifier is $(O-)_3Si-R_5-CH_2=CH_2$; when the third modifier is $(O-)_3Si-R_5-CH_2=CH_2$, the fourth modifier is $(O-)_3Si-R_4-SH$.

The preparation method of the composite according to the embodiment of the present application is simple, safe and easy to operate. First, the surface of the silica-coated quantum dots and the surface of the graphene nanosheets are modified, respectively, so that the respective surfaces are connected with modifiers that can react with each other, thus $(O-)_3Si-R_4-SCH_2CH_2-R_5-Si(O-)_3$ is formed by the modifiers reaction which is connected to the surface. $(O-)_3Si-R_4-SCH_2CH_2-R_5-Si(O-)_3$ bonds silica-coated quantum dots with graphene nanosheets together to obtain the unique structure of the composites in the embodiments of this application.

In the above preparation method, when the third modifier is $(O-)_3Si-R_4-SH$, the third modifier is selected from silane coupling agents with mercapto group, and the fourth modifier is selected from silane coupling agents with vinyl group. That is, the third modifier is selected from silane coupling agents with mercapto group (that is, a mercaptosilane coupling agent). In this case, the process of modifying the silica-coated quantum dots may include: directly using a silane coupling agent with mercapto group to perform mercapto modification on the silica-coated quantum dots to obtain "silica-coated quantum dots $(O-)_3Si-R_4-SH$". The fourth modifier is selected from silane coupling agents with vinyl group. In this case, the process of modifying graphene nanosheets may include: directly using a silane coupling agent with vinyl group to perform vinylation modification on the graphene nanosheets to obtain "graphene nanosheets-$(O-)_3Si-R_5-CH_2=CH$". Finally, a composite is obtained (FIG. 3b) by the reaction of "graphene nanosheets —(O—)$_3$Si—R$_5$—CH$_2$=CH" and "silica-coated quantum dots (O—)$_3$Si—R$_4$—SH".

Alternatively, when the fourth modifier is (O—)$_3$Si—R$_4$—SH, the fourth modifier is selected from silane coupling agents with mercapto group, and the third modifier is selected from silane coupling agents with vinyl group. That is, the third modifier is selected from silane coupling agents with vinyl group (that is, a vinyl silane coupling agent). In this case, the process of modifying the silica-coated quantum dots may include: directly using a silane coupling agent with vinyl group to perform vinylation modification on the silica-coated quantum dots to obtain "silica-coated quantum dots —(O—)$_3$Si—R$_5$—CH$_2$=CH". The fourth modifier is selected from silane coupling agents with mercapto group. At this time, the process of modifying graphene nanosheets may include: directly using silane coupling agents with mercapto group to perform mercapto modification on the graphene nanosheets to obtain "graphene nanosheets —(O—)$_3$Si—R$_4$—SH". Finally, "graphene nanosheets —(O—)$_3$Si—R$_4$—SH "reacts with" silica-coated quantum dots —(O—)$_3$Si—R$_5$—CH$_2$=CH" to produce a composite (FIG. 3a).

The above silane coupling agents with mercapto group is at least one selected from γ-mercapto propyl trimethoxy silane and γ-mercapto propyl triethoxy silane; the silane coupling agents with vinyl group is at least one selected from vinyl trimethoxy silane, vinyltriethoxy silane, vinyl trichlorosilane, vinyl tri (β-methoxy ethoxy) silane, vinyl tritert-butoxy silane, vinyl tritert-butyl peroxy silane and vinyl triacetoxy silane. R$_4$ is the hydrocarbyl or hydrocarbyl derivatives in the silane coupling agents with mercapto group, which can be specifically a hydrocarbyl or a hydrocarbyl derivative with a carbon atom number of 2-20; R$_5$ is the hydrocarbyl or hydrocarbyl in the silane coupling agents with vinyl group which can be specifically a hydrocarbyl or a hydrocarbyl derivative with a carbon atom number of 2-20. In an embodiment of the present application, R$_4$ and R$_5$ are respectively selected from a group consisting of —CH$_2$CH$_2$— or —CH$_2$CH$_2$CH$_2$—.

In an embodiment, in the above steps T01 and T02: the specific process of mercapto modification of graphene nanosheets or silica-coated quantum dots is: (1) disperse graphene nanosheets or silica-coated quantum dots in a polar solvent to form graphene nanosheets or silica-coated quantum dots solution; (2) at room temperature, add a silane coupling agent with mercapto group to the above graphene nanosheets or silica-coated quantum dots solution, and react at 40~150° C. for 20 min~24 h. When the reaction is completed, after washing and drying with water, graphene nanosheets or silica-coated quantum dots with mercapto modified surface can be obtained.

The above polar solvents include at least one selected from water, ethanol, methanol, glycerin, propylene glycol, acetonitrile, propanol, dioxane, tetrahydrofuran, methyl ethyl ketone and n-butanol, etc.; the volume concentration of silane coupling agent with mercapto group in the mixed solution is 0.1~50 mL/mL.

In an embodiment, in the above steps T01 and T02: the specific process of vinylation modification of graphene nanosheets or silica-coated quantum dots is: (1) disperse graphene nanosheets or silica-coated quantum dots into the polar solvent and form graphene nanosheets solution or silica-coated quantum dots solution; (2) at room temperature, add silane coupling agents with vinyl group to the above graphene nanosheets solution or silica-coated quantum dots solution and react at 40~150° C. for 20 min~24 hours. When the reaction is completed, after washing and drying with water, graphene nanosheets or silica-coated quantum dots with vinylation modified surface can be obtained.

The above polar solvents include water, ethanol, methanol, glycerin, propylene glycol, acetonitrile, propanol, dioxane, tetrahydrofuran, methyl ethyl ketone and n-butanol etc.

In an embodiment of the above step T03: the graphene nanosheets with the fourth modifier on the surface thereof and the silica-coated quantum dots with the third modifier on the surface thereof are mixed and making the steps of combining the silica coated quantum dots with the graphene nanosheets by the (O—)$_3$Si—R$_4$—SCH$_2$CH$_2$—R$_5$—Si(O—)$_3$ formed by the reaction of the third modifier and the fourth modifier comprise: mix the graphene nanosheets with the fourth modifier on the surface thereof and the silica-coated quantum dots with the third modifier on the surface thereof under the condition of ultraviolet light or the action of the second initiator, making occurrence of free radical reaction by the vinyl group and sulfhydryl to obtain the composite.

The mercapto group and vinyl group are bonded by Click chemistry. Under the action of the second initiator or ultraviolet light, the mercapto group in the modifier generates free radicals, which performs a free radical reaction with the vinyl group in another modifier. The formed (O—)$_3$Si—R$_4$—SCH$_2$CH$_2$—R$_5$—Si(O—)$_3$ by such reaction bonds the silica-coated quantum dots with graphene nanosheets to obtain the composite with a unique structure according to the embodiment of the present application.

In an embodiment, the second initiator is at least one selected from dimethylphenylphosphine and triethylamine.

Finally, the embodiments of the present application provide an application of the composite. The above-mentioned composites of the embodiments of the present application or the composites obtained by the above-mentioned preparation methods of the embodiments of the present application are used as the light emitting layer materials of quantum dots light emitting diodes.

The composite provided by the embodiments of the present application has very good stability and luminous efficiency. Therefore, when the composite can be applied to the light-emitting layer of a QLED device, the composite not only improves the luminous efficiency of quantum dots, but also improves the internal and external quantum efficiency and increases the luminous efficiency of QLED devices.

The present application has been tested several times in succession, and now the partial testing results are used as a reference to describe the application in further detail. The following detailed description will be made in combination with specific embodiments.

Example 1

A preparation method of the composite was performed as follows:

1. Coating of CdSe/CdS Quantum Dots Particles by Silica

At room temperature, 30 mL of a n-hexane solution having a concentration of 10 mg/mL of CdSe/CdS was put into a 250 mL round-bottom flask. 3 mL of a methyl isobutyl ketone solution having 50 mg of perhydropolysilazane was added to the flask and fully stirred at room temperature for 2 hrs to obtain silica-coated CdSe/CdS quantum dots particles.

2. Coating of CdSe/CdS Quantum Dots Particles with Silica Having Carboxyl Functional Groups on the Surface Thereof (1) At room temperature, the above-prepared silica-coated CdSe/CdS quantum dots particles were dispersed into the aqueous solution, then 0.5 mL of γ-aminopropyl triethoxy silane and 2 mL of an ammonia solution were added to the above solution for reaction at 50° C. for 2 hrs. When the reaction was completed, the product was washed with water and dried to obtain silica coated CdSe/CdS quantum dots particles having amino functional groups on the surface;

(2) 300 mg of the dried silica coated CdSe/CdS quantum dots particles having amino functional groups on the surface was dispersed in water, 5 mg of trimellitic anhydride was added to the above reaction system, and then stirred at room temperature for 8 h. When the reaction was completed, the product was washed with water and dried to obtain silica-coated CdSe/CdS quantum dots particles with carboxyl functional groups on the surface.

3. Preparation of Graphene with Aminated Surface 20 mL of graphene nanosheets aqueous solution having a concentration of 10 mg/mL was put into a 50 mL round bottom flask and vigorously stirred, 200 μL of 3-aminopropyl triethoxy silane was added for reaction at room temperature for 12 hrs. When the reaction was completed, resulting products were washed with water and dried to obtain graphene nanosheets with amino functional groups on the surface.

4. Preparation of CdSe/CdS Quantum Dots Composite Particles 10 mL of a solution containing the above silica-coated CdSe/CdS quantum dots aqueous solution with carboxyl functional groups on the surface having a concentration of 10 mg/mL was put into a 50 mL round bottom flask. Under vigorous stirring, an ammonia solution was added to the solution until the pH value of the solution was 7, and then a phosphate buffer solution was added to the solution to stabilize the pH of the solution. 1 mL, 10 mg/mL of aqueous solution of aminated graphene particles and 0.0001 mg of EDC were continued to added to the solution, and the reaction is continued at room temperature for 60 mins to obtain CdSe/CdS quantum dots composite particles.

Example 2

1. Coating of InP/ZnS Quantum Dots Particles by Silica

At room temperature, 30 mL of a n-hexane solution with a concentration of 10 mg/mL of CdSe/CdS was put into a 250 mL round-bottom flask. 3 mL of a methyl isobutyl ketone solution having 50 mg of perhydropolysilazane was added to the flask and fully stirred at room temperature for 2 hrs to obtain silica-coated InP/ZnS quantum dots particles.

2. Coating of InP/ZnS Quantum Dots Particles with Silica Having Carboxyl Functional Groups on the Surface Thereof (1) At room temperature, the above-prepared silica-coated InP/ZnS quantum dots particles were dispersed into the aqueous solution, then 0.5 mL of γ-aminopropyl triethoxy silane and 2 mL of an ammonia solution were added to the above solution for reaction at 50° C. for 2 hrs. When the reaction was completed, the product was washed with water and dried to obtain silica coated InP/ZnS quantum dots particles having amino functional groups on the surface;

(2) 300 mg of the dried silica coated InP/ZnS quantum dots particles having amino functional groups on the surface was dispersed in water, 5 mg of trimellitic anhydride was added to the above reaction system, and then stirred at room temperature for 8 h. When the reaction was completed, the product was washed with water and dried to obtain silica-coated InP/ZnS quantum dots particles with carboxyl functional groups on the surface.

3. Preparation of Graphene with Aminated Surface 20 mL of graphene nanosheets aqueous solution having a concentration of 10 mg/mL was put into a 50 mL round bottom flask and vigorously stirred, 200 μL of 3-aminopropyl triethoxy silane was added for reaction at room temperature for 12 hrs. When the reaction was completed, resulting products were washed with water and dried to obtain graphene nanosheets with amino functional groups on the surface.

4. Preparation of InP/ZnS Quantum Dots Composite Particles 10 mL of a solution containing the above silica-coated InP/ZnS quantum dots aqueous solution with carboxyl functional groups on the surface having a concentration of 10 mg/mL was put into a 50 mL round bottom flask. Under vigorous stirring, an ammonia solution was added to the solution until the pH value of the solution was 7, and then a phosphate buffer solution was added to the solution to stabilize the pH of the solution. 1 mL, 10 mg/mL of aqueous solution of aminated graphene particles and 0.0001 mg of EDC were continued to added to the solution, and the reaction is continued at room temperature for 60 mins to obtain InP/ZnS quantum dots composite particles.

Example 3

1. Coating of CdSe/CdS Quantum Dots Particles by Silica

At room temperature, 30 mL of a n-hexane solution with a concentration of 10 mg/mL of CdSe/CdS was put into a 250 mL round-bottom flask. 3 mL of a methyl isobutyl ketone solution having 50 mg of perhydropolysilazane was added to the flask and fully stirred at room temperature for 2 hrs to obtain silica-coated CdSe/CdS quantum dots particles.

2. Coating CdSe/CdS Quantum Dots Particles with Amino Functional Group on the Surface by Silica At room temperature, the above-prepared silica-coated CdSe/CdS quantum dots particles were dispersed into the aqueous solution, 200 μL of 3-aminopropyl triethoxy silane was added to the above solution for reaction at room temperature for 12 hrs. When the reaction was completed, resulting products were washed with water and dried to obtain the silica coated CdSe/CdS quantum dots particles with amino functional group on the surface.

3. Preparation of Graphene with Carboxyl Functional Groups on the Surface (1) 0.5 mL of γ-aminopropyl triethoxy silane and 2 mL of ammonia solution were added into the 20 mL of graphene nanosheets aqueous solution having a concentration of 20 mg/mL for reaction at 50° C. for 2 hrs. When the reaction was completed, the resulting product was washed with water and dried to obtain graphene with amino functional groups on the surface;

(2) 300 mg of the graphene with amino functional groups on the surface was dispersed in water, 5 mg of trimellitic anhydride was added to the above reaction system, and stirred at room temperature for 8 hrs. When the reaction was completed, the resulting product was washed with water and dried to obtain the graphene with carboxyl functional groups on the surface.

4. Preparation of CdSe/CdS Quantum Dots Composite Particles 10 mL of graphene particles aqueous solution with carboxyl functional groups on the surface having a concentration of 10 mg/mL was put into a 50 mL of round bottom flask. Under vigorous stirring, ammonia solution was added to the solution until the pH value of the solution was 7, and then phosphate buffer solution was added to the solution to stabilize the pH of the solution. Then 1 mL of aqueous solution of silica-coated CdSe/CdS quantum dots with amino functional groups on the surface having a concentration of 10 mg/mL and 0.0001 mg of EDC were added to the above solution for reaction at room temperature for 60 mins to obtain CdSe/CdS quantum dots composite particles.

Example 4

Coating of InP/ZnS Quantum Dots Particles by Silica

At room temperature, 30 mL of a n-hexane solution with a concentration of 10 mg/mL of InP/ZnS was put into a 250 mL round-bottom flask. 3 mL of a methyl isobutyl ketone solution having 50 mg of perhydropolysilazane was added to the flask and fully stirred at room temperature for 2 hrs to obtain silica-coated InP/ZnS quantum dots particles.

2. Coating InP/ZnS Quantum Dots Particles with Amino Functional Group on the Surface by Silica At room temperature, the above-prepared silica-coated InP/ZnS quantum dots particles were dispersed into the aqueous solution, 200 µL of 3-aminopropyl triethoxy silane was added to the above solution for reaction at room temperature for 12 hrs. When the reaction was completed, resulting products were washed with water and dried to obtain the silica coated InP/ZnS quantum dots particles with amino functional group on the surface.

3. Preparation of Graphene with Carboxyl Functional Groups on the Surface (1) 0.5 mL of γ-aminopropyl triethoxy silane and 2 mL of ammonia solution were added into the 20 mL of graphene nanosheets aqueous solution having a concentration of 20 mg/mL for reaction at 50° C. for 2 hrs. When the reaction was completed, the resulting product was washed with water and dried to obtain graphene with amino functional groups on the surface;

(2) 300 mg of the graphene with amino functional groups on the surface was dispersed in water, 5 mg of trimellitic anhydride was added to the above reaction system, and stirred at room temperature for 8 hrs. When the reaction was completed, the resulting product was washed with water and dried to obtain the graphene with carboxyl functional groups on the surface.

4. Preparation of InP/ZnS Quantum Dots Composite Particles 10 mL of graphene particles aqueous solution with carboxyl functional groups on the surface having a concentration of 10 mg/mL was put into a 50 mL of round bottom flask. Under vigorous stirring, ammonia solution was added to the solution until the pH value of the solution was 7, and then phosphate buffer solution was added to the solution to stabilize the pH of the solution. Then 1 mL of aqueous solution of silica-coated InP/ZnS quantum dots with amino functional groups on the surface having a concentration of 10 mg/mL and 0.0001 mg of EDC were added to the above solution for reaction at room temperature for 60 mins to obtain InP/ZnS quantum dots composite particles.

Example 5

1. Coating CdSe/CdS Quantum Dots Particles by Silica

At room temperature, 30 mL of n-hexane solution having a concentration of 10 mg/mL of CdSe/CdS was put into a 250 mL of round-bottom flask. 3 mL of methyl isobutyl ketone solution having 50 mg of perhydropolysilazane was added to the flask and stirred at room temperature for 2 hrs to obtain silica-coated CdSe/CdS quantum dots particles.

2. Coating CdSe/CdS Quantum Dots Particles with Mercapto Functional Groups on the Surface Thereof by Silica At room temperature, the above-prepared silica-coated CdSe/CdS quantum dots particles were dispersed into an aqueous solution, then 0.5 mL of mercaptopropyl trimethoxy silane was added to the above solution for reaction at 80° C. for 2 hrs. When the reaction was completed, the resulting product was washed with water and dried to obtain silica-coated CdSe/CdS quantum dots particles with mercapto functional groups on the surface;

3. Preparation of Graphene with Vinylated Surface 20 mL of graphene nanosheets aqueous solution having a concentration of 10 mg/mL was put into a 50 mL round bottom flask and vigorously stirred, 200 µL of vinyltriethoxysilane was added to the above solution for reaction at room temperature for 12 hrs. When the reaction was completed, after washing and drying with water, graphene nanosheets with vinyl functional groups on the surface were obtained.

4. Preparation of CdSe/CdS Quantum Dots Composite Particles 10 mL the above silica-coated CdSe/CdS quantum dots particles aqueous solution with mercapto functional groups on the surface thereof having a concentration of 10 mg/mL was added into a 50 mL round bottom flask. Under vigorous stirring, 1 mL of graphene nanosheets aqeuous solution with vinyl functional groups on the surface having a concentration of 10 mg/mL was added to the above solution for the reaction under ultraviolet light and room temperature for 60 mins to obtain CdSe/CdS quantum dots composite particles.

Example 6

1. Coating InP/ZnS Quantum Dots Particles by Silica

At room temperature, 30 mL of n-hexane solution having a concentration of 10 mg/mL of InP/ZnS was put into a 250 mL of round-bottom flask. 3 mL of methyl isobutyl ketone solution having 50 mg of perhydropolysilazane was added to the flask and stirred at room temperature for 2 hrs to obtain silica-coated InP/ZnS quantum dots particles.

2. Coating InP/ZnS Quantum Dots Particles with Mercapto Functional Groups on the Surface Thereof by Silica At room temperature, the above-prepared silica-coated InP/ZnS quantum dots particles were dispersed into an aqueous solution, then 0.5 mL of mercaptopropyl trimethoxy silane was added to the above solution for reaction at 80° C. for 2 hrs. When the reaction was completed, the resulting product was washed with water and dried to obtain silica-coated InP/ZnS quantum dots particles with mercapto functional groups on the surface;

3. Preparation of Graphene with Vinylated Surface 20 mL of graphene nanosheets aqueous solution having a concentration of 10 mg/mL was put into a 50 mL round bottom flask and vigorously stirred, 200 µL of vinyltriethoxysilane was added to the above solution for reaction at room temperature for 12 hrs. When the reaction was completed, after washing and drying with water, graphene nanosheets with vinyl functional groups on the surface were obtained.

4. Preparation of InP/ZnS Quantum Dots Composite Particles 10 mL the above silica-coated InP/ZnS quantum dots particles aqueous solution with mercapto functional groups on the surface thereof having a concentration of 10 mg/mL was added into a 50 mL round bottom flask. Under vigorous stirring, 1 mL of graphene nanosheets aqeuous solution with vinyl functional groups on the surface having a concentration of 10 mg/mL was added to the above solution for the reaction under ultraviolet light and room temperature for 60 mins to obtain InP/ZnS quantum dots composite particles.

Example 7

1. Coating CdSe/CdS Quantum Dots Particles by Silica

At room temperature, 30 mL of n-hexane solution having a concentration of 10 mg/mL of CdSe/CdS was put into a 250 mL of round-bottom flask. 3 mL of methyl isobutyl ketone solution having 50 mg of perhydropolysilazane was added to the flask and stirred at room temperature for 2 hrs to obtain silica-coated CdSe/CdS quantum dots particles.

2. Coating CdSe/CdS Quantum Dots Particles with Vinylated Surface by Silica

At room temperature, the above-prepared silica-coated CdSe/CdS quantum dots particles were dispersed into an aqueous solution, then 0.5 mL of vinyltriethoxysilane was added to the above solution for reaction at 80° C. for 2 hrs. When the reaction was completed, the resulting product was washed with water and dried to obtain silica-coated CdSe/CdS quantum dots particles with vinyl functional groups on the surface;

3. Preparation of Graphene with Mercapto Functional Groups on the Surface Thereof 20 mL of graphene nanosheets aqueous solution having a concentration of 10 mg/mL was put into a 50 mL round bottom flask and vigorously stirred, 200 μL of mercaptopropyl trimethoxy silane was added the above solution for reaction at room temperature for 12 hrs. When the reaction was completed, after washing and drying with water, graphene nanosheets with mercapto functional groups on the surface were obtained.

4. Preparation of CdSe/CdS Quantum Dots Composite Particles 10 mL of the above mentioned silica-coated CdSe/CdS quantum dots particles aqueous solution with vinyl functional groups on the surface thereof having a concentration of 10 mg/mL was put into a 50 mL round bottom flask. Under vigorous stirring, 1 mL of graphene nanosheets aqeuous solution with mercapto functional groups on the surface having a concentration of 10 mg/mL was added for reaction under ultraviolet light and room temperature for 60 mins to obtain CdSe/CdS quantum dots composite particles.

Example 8

1. Coating InP/ZnS Quantum Dots Particles by Silica

At room temperature, 30 mL of n-hexane solution having a concentration of 10 mg/mL of InP/ZnS was put into a 250 mL of round-bottom flask. 3 mL of methyl isobutyl ketone solution having 50 mg of perhydropolysilazane was added to the flask and stirred at room temperature for 2 hrs to obtain silica-coated InP/ZnS quantum dots particles.

2. Coating InP/ZnS Quantum Dots Particles with Vinylated Surface by Silica

At room temperature, the above-prepared silica-coated InP/ZnS quantum dots particles were dispersed into an aqueous solution, then 0.5 mL of vinyltriethoxysilane was added to the above solution for reaction at 80° C. for 2 hrs. When the reaction was completed, the resulting product was washed with water and dried to obtain silica-coated InP/ZnS quantum dots particles with vinyl functional groups on the surface;

3. Preparation of Graphene with Mercapto Functional Groups on the Surface Thereof 20 mL of graphene nanosheets aqueous solution having a concentration of 10 mg/mL was put into a 50 mL round bottom flask and vigorously stirred, 200 μL of mercaptopropyl trimethoxy silane was added the above solution for reaction at room temperature for 12 hrs. When the reaction was completed, after washing and drying with water, graphene nanosheets with mercapto functional groups on the surface were obtained.

4. Preparation of InP/ZnS Quantum Dots Composite Particles 10 mL of the above mentioned silica-coated InP/ZnS quantum dots particles aqueous solution with vinyl functional groups on the surface thereof having a concentration of 10 mg/mL was put into a 50 mL round bottom flask. Under vigorous stirring, 1 mL of graphene nanosheets aqeuous solution with mercapto functional groups on the surface having a concentration of 10 mg/mL was added for reaction under ultraviolet light and room temperature for 60 mins to obtain InP/ZnS quantum dots composite particles.

The above are only optional embodiments of the present application, and are not intended to limit the present application. For those skilled in the art, the present application may have various modifications and changes. Any modification, equivalent replacement, improvement, etc. within the spirit and principle of this application shall be included in the scope of the claims of this application.

What is claimed is:

1. A composite, wherein the composite comprises silica-coated quantum dots and graphene nanosheets bonded to the surface of each of the silica-coated quantum dots; wherein each of the silica coated quantum dots comprises a quantum dot and a silica layer coated on the surface of the quantum dot, and the graphene nanosheets and the silica layer are bonded by $(O-)_3Si-R_1-NHCO-R_3-CONH-R_2-Si(O-)_3$ or $(O-)_3Si-R_4-SCH_2CH_2-R_5-Si(O-)_3$, wherein $R_1$, $R_2$, $R_4$, and $R_5$ are respectively selected from a group consisting of a hydrocarbyl and a hydrocarbyl derivative, and $R_3$ is selected from a group consisting of a hydrocarbyl, a hydrocarbyl derivative, an aryl, and an aryl derivative.

2. The composite according to claim 1, wherein the thickness of the silica layer is 2-20 nm.

3. The composite according to claim 1, wherein the size of each of the graphene nanosheets is 2-20 nm.

4. The composite according to claim 1, wherein the graphene nanosheets and the silica layer are bonded by $(O-)_3Si-R_1-NHCO-R_3-CONH-R_2-Si(O-)_3$, $R_1$ and $R_2$ are respectively selected from a group consisting of a hydrocarbyl with a carbon atom number of 2-20 or a hydrocarbyl derivative with a carbon atom number of 2-20, $R_3$ is selected from a group consisting of a hydrocarbyl with a carbon atom number of 2-20, a hydrocarbyl derivative with a carbon atom number of 2-20, an aryl with a carbon atom number of 6-20, or an aryl derivative with a carbon atom number of 6-20.

5. The composite according to claim 4, wherein R1 and R2 are respectively any one selected from the group consisting of $-CH_2CH_2-$, $-CH_2CH_2CH_2-$, $-CH_2CH_2CH_2CH_2-$, $-CH_2CH_2NHCH_2CH_2-$, $-CH_2CH_2CH_2NHCH_2CH_2-$, and $-CH_2CH_2CH_2NHCH_2CH_2CH_2-$.

6. The composite according to claim 4, wherein $R_3$ is any one selected from the group consisting of —$CH_2CH_2$—, —$CH_2CH_2CH_2$—,

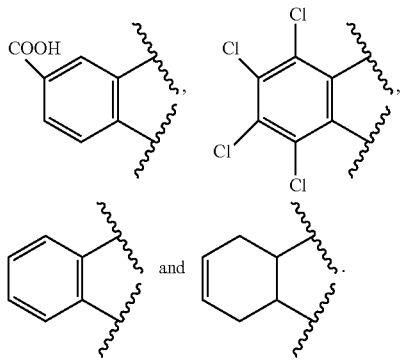

7. The composite according to claim 1, wherein the graphene nanosheets and the silica layer are bonded by (O—)$_3$Si—$R_4$—SCH$_2$CH$_2$—$R_5$—Si(O—)$_3$, $R_4$ and $R_5$ are respectively selected from a group consisting of a hydrocarbyl with a carbon atom number of 2-20 or a hydrocarbyl derivative with a carbon atom number of 2-20.

8. The composite according to claim 7, wherein $R_4$ and $R_5$ are respectively selected from a group consisting of —$CH_2CH_2$— or —$CH_2CH_2CH_2$—.

9. A preparation method of the composite, comprising the following steps:
providing silica-coated quantum dots, wherein each of the silica-coated quantum dots comprises a quantum dot and a silica layer coated on a surface of the quantum dot, a surface of the silica layer is bonded with a first modifier, and the first modifier is (O—)$_3$Si—$R_1$—NH$_2$ or (O—)$_3$Si—$R_1$—NHCO—$R_3$—COOH, wherein $R_1$ is selected from a group consisting of a hydrocarbyl or a hydrocarbyl derivative, and $R_3$ is selected from a group consisting of a hydrocarbyl, a hydrocarbyl derivative, an aryl, or an aryl derivative;
providing graphene nanosheets, wherein the surface of each of the graphene nanosheets is bonded with a second modifier, the second modifier is (O—)$_3$Si—$R_2$—NHCO—$R_3$—COOH or (O—)$_3$Si—$R_2$—NH$_2$, where $R_2$ is selected from a group consisting of a hydrocarbyl or a hydrocarbyl derivative;
mixing the graphene nanosheets with the second modifier on the surface thereof and the silica-coated quantum dots with the first modifier on the surface thereof to bond the silica-coated quantum dots and the graphene nanosheets by the (O—)$_3$Si—$R_1$—NHCO—$R_3$—CONH—$R_2$—Si(O—)$_3$ which is formed by the reaction of the first modifier and the second modifier, whereby obtaining the composite;
wherein, when the first modifier is (O—)$_3$Si—$R_1$—NH$_2$, the second modifier is (O—)$_3$Si—$R_2$—NHCO—$R_3$—COOH; when the first modifier is (O—)$_3$Si—$R_1$—NHCO—$R_3$—COOH, the second modifier is (O—)$_3$Si—$R_2$—NH$_2$.

10. The preparation method according to claim 9, wherein the step of mixing the graphene nanosheets with the second modifier on the surface thereof and the silica-coated quantum dots with the first modifier on the surface thereof to bond the silica-coated quantum dots with the graphene nanosheets by (O—)$_3$Si—$R_1$—NHCO—$R_3$—CONH—$R_2$—Si(O—)$_3$ which is formed by the reaction of the first modifier and the second modifier comprises:
mixing the graphene nanosheets with the second modifier on the surface thereof with the silica-coated quantum dots with the first modifier on the surface thereof under an acidic condition and the action of a first initiator to conduct a condensation reaction to obtain the composite.

11. The preparation method according to claim 10, wherein the first initiator is at least one selected from a group consisting of carbodiimide and N-hydroxysuccinimide.

12. The preparation method according to claim 10, wherein the pH of the acidic condition is greater than or equal to 4 and less than 7.

13. The preparation method according to claim 9, wherein $R_1$ and $R_2$ are respectively selected from a group consisting of a hydrocarbyl with a carbon atom number of 2-20 or a hydrocarbyl derivative with a carbon atom number of 2-20, and $R_3$ is selected from a group consisting of a hydrocarbyl with a carbon atom number of 2-20, a hydrocarbyl derivative with a carbon atom number of 2-20, an aryl with a carbon atom number of 6-20, or an aryl derivative with a carbon atom number of 6-20.

14. The preparation method according to claim 13, wherein $R_1$ and $R_2$ are respectively any one selected from a group consisting of —$CH_2CH_2$—, —$CH_2CH_2CH_2$—, —$CH_2CH_2CH_2CH_2$—, —$CH_2CH_2NHCH_2CH_2$—, —$CH_2CH_2CH_2NHCH_2CH_2$— and —$CH_2CH_2CH_2NHCH_2CH_2CH_2$—; and/or, $R_3$ is any one selected from a group consisting of —$CH_2CH_2$—, —$CH_2CH_2CH_2$—,

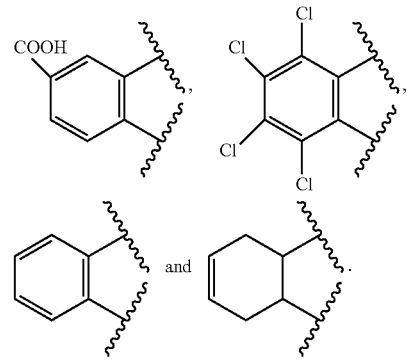

15. A preparation method of the composite, comprising the following steps:
providing silica-coated quantum dots, wherein each of the silica-coated quantum dots comprises a quantum dot and a silica layer coated on a surface of the quantum dot, a surface of the silica layer is bonded with a third modifier, and the third modifier is (O—)$_3$Si—$R_4$—SH or (O—)$_3$Si—$R_5$—CH$_2$=CH$_2$, wherein $R_4$ and $R_5$ are respectively selected from a group consisting of a hydrocarbyl or a hydrocarbyl derivative;
providing graphene nanosheets, wherein the surface of each of the graphene nanosheets is bonded with a fourth modifier, the fourth modifier is (O—)$_3$Si—$R_5$—CH$_2$=CH$_2$ or (O—)$_3$Si—$R_4$—SH;
mixing graphene nanosheets with the fourth modifier on the surface thereof and silica-coated quantum dots with the third modifier on the surface thereof to bond the silica-coated quantum dots and the graphene nanosheets by (O—)$_3$Si—$R_4$—SCH$_2$CH$_2$—$R_5$—Si (O—)$_3$ which is formed by the reaction between the third modifier and the fourth modifier whereby obtaining the composite;

wherein, when the third modifier is (O—)$_3$Si—R$_4$—SH, the fourth modifier is (O—)$_3$Si—R$_5$—CH$_2$=CH$_2$; when the third modifier is (O—)$_3$Si—R$_5$—CH$_2$=CH$_2$, the fourth modifier is (O—)$_3$Si—R$_4$—SH.

16. The preparation method according to claim 15, wherein the step of mixing graphene nanosheets with the fourth modifier on the surface thereof and the silica-coated quantum dots with the third modifier on the surface thereof to bond the silica coated quantum dots and the graphene nanosheets by the (O—)$_3$Si—R$_4$—SCH$_2$CH$_2$—R$_5$—Si(O—)$_3$ which is formed by the reaction of the third modifier and the fourth modifier comprise:

mixing the graphene nanosheets with the fourth modifier on the surface thereof and the silica-coated quantum dots with the third modifier on the surface thereof under a condition of ultraviolet light or the action of the second initiator, making occurrence of free radical reaction by the vinyl group and sulfhydryl to obtain the composite.

17. The preparation method according to claim 16, wherein the second initiator is at least one selected from a group consisting of dimethylphenylphosphine and triethylamine.

18. The preparation method according to claim 15, wherein R$_4$ and R$_5$ are respectively selected from a group consisting of a hydrocarbyl with a carbon atom number of 2-20 or a hydrocarbyl derivative with a carbon atom number of 2-20.

19. The preparation method of claim 18, wherein R$_4$ and R$_5$ are respectively selected from a group consisting of —CH$_2$CH$_2$— and —CH$_2$CH$_2$CH$_2$—.

20. A method of using a composite according to claim 1, the method comprising using the composite to form a light-emitting layer material of a quantum dot light-emitting diode.

* * * * *